United States Patent
Furuta et al.

(10) Patent No.: US 7,743,289 B2
(45) Date of Patent: Jun. 22, 2010

(54) SOFT ERROR RATE CALCULATION METHOD AND PROGRAM, INTEGRATED CIRCUIT DESIGN METHOD AND APPARATUS, AND INTEGRATED CIRCUIT

(75) Inventors: Hiroshi Furuta, Kanagawa (JP); Junji Monden, Kanagawa (JP); Ichiro Mizuguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 481 days.

(21) Appl. No.: 11/896,219

(22) Filed: Aug. 30, 2007

(65) Prior Publication Data
US 2008/0256403 A1  Oct. 16, 2008

(30) Foreign Application Priority Data
Sep. 8, 2006  (JP) .............................. 2006-244699

(51) Int. Cl.
*G06F 11/00* (2006.01)
(52) U.S. Cl. ......................................... 714/704; 714/37
(58) Field of Classification Search ................. 257/532, 257/288; 365/154; 438/201; 360/210; 714/742, 714/704, 37
See application file for complete search history.

(56) References Cited

U.S. PATENT DOCUMENTS

| | | | | |
|---|---|---|---|---|
| 5,917,247 | A * | 6/1999 | Narita ........................ | 257/532 |
| 6,795,332 | B2 * | 9/2004 | Yamaoka et al. ............ | 365/154 |
| 6,900,086 | B2 * | 5/2005 | Mori et al. .................. | 438/201 |
| 7,230,781 | B2 * | 6/2007 | Ma et al. ..................... | 360/31 |
| 7,364,961 | B2 * | 4/2008 | Liaw ........................... | 438/210 |
| 7,394,119 | B2 * | 7/2008 | Fukui ......................... | 257/288 |
| 2007/0226572 | A1 * | 9/2007 | Zhang et al. ................ | 714/742 |

FOREIGN PATENT DOCUMENTS

JP  2004-251813 A  9/2004

OTHER PUBLICATIONS

E.H. Cannon et al., "SRAM SER in 90, 130 and 180 NM Bulk and SOI Technologies," 2004 IEEE International Reliability Physics Symposium, pp. 300-304.

P Hazucha et al., "Neutron Soft Error Rate Measurements in a 90-nm CMOS Process and Scaling Trends in SRAM from 0.25-μm to 90-nm Generation," 2003 IEEE International Electron Devices Meeting Technical Digest, pp. 523-526.

(Continued)

*Primary Examiner*—David Ton
(74) *Attorney, Agent, or Firm*—Foley & Lardner LLP

(57) ABSTRACT

A first mathematical expression indicating a dependence of SER on an information storage node diffusion layer area at the same information storage node voltage Vn is derived with a use of a result of measuring a relationship between SER and the information storage node diffusion layer area of a storage circuit or an information holding circuit composed of MISFET using a plurality of information storage node voltages Vn as a parameter. Then, a second mathematical expression is derived from the measurement result by substituting a relationship indicating a dependence of SER on an information storage node voltage at the same information storage node diffusion layer area Sc into the first mathematical expression. SER can be calculated by substituting a desired information storage node diffusion layer area and a desired information storage node voltage of a storage circuit or an information holding circuit into the second mathematical expression.

19 Claims, 9 Drawing Sheets

OTHER PUBLICATIONS

H. Fukui et al., "Comprehensive Study on Layout Dependence of Soft Errors in CMOS Latch Circuits and Its Scaling Trend for 65 nm Technology Node and Beyond," 2005 IEEE Symposium on VLSI Tech. Digest of Technical Papers, pp. 222-223.

C. Hu, "Alpha-Particle-Induced Field and Enhanced Collection of Carriers," IEEE Electron Device Letters, vol. EDL-3, No. 2, pp. 31-34, 1982.

S-M Jung et al., "Soft Error Immune 0.45μm$^2$ SRAM Cell with MIM Node Capacitor by 65nm CMOS Technology for Ultra High Speed SRAM," 2003 IEEE International Electron Devices Meeting Technical Digest, pp. 289-292.

K. Osada et al., "SRAM Immunity to Cosmic-Ray-Induced Multierrors Based on Analysis of an Induced Parasitic Bipolar Effect," IEEE Journal of Solid-State Circuits, vol. 39, No. 5, pp. 827-833, 2004.

P.E. Dodd et al., "Neutron-Induced Soft Errors, Latchup, and Comparison of SER Test Methods for SRAM Technologies," 2002 IEEE International Electron Devices Meeting Technical Digest, pp. 333-336.

E. Takeda et al., "A Cross Section of α-Particle-Induced Soft-Error Phenomena in VLSI's," IEEE Transactions on Electron Devices, vol. 36, No. 11, pp. 2567-2575, 1989.

E. Takeda et al., "A New Soft-Error Phenomenon in VLSIs; the alpha-particle-induced source/drain penetration (ALPEN) effect," 1988 IEEE International Reliability Physics Symposium, pp. 109-112.

Y. Tosaka et al., "Simple Method for Estimating Neutron-Induced Soft Error Rates Based on Modified BGR Model," IEEE Electron Device Letters, vol. EDL-20, No. 2, pp. 89-91, 1999.

* cited by examiner

SOFT ERROR RATE CALCULATION METHOD AND PROGRAM, INTEGRATED CIRCUIT DESIGN METHOD AND APPARATUS, AND INTEGRATED CIRCUIT

BACKGROUND OF THE INVENTION

1. Field of the Invention

The present invention relates to a semiconductor integrated circuit including a storage circuit or an information holding circuit composed of a transistor, a soft error rate calculation method and a program of the same, and a design method and a design apparatus of the same.

2. Description of Related Art

A soft error is one of the problems caused by scaling process of recent semiconductor devices. In a narrow sense, a soft error of semiconductor devices is a temporal defect that causes the "inversion" of information due to the loss of charges that are accumulated in a storage node by radiation. Combined with the trend for low-voltage circuit design, the soft error will become a serious problem.

One measure against this problem is to improve the resistance to soft errors by adding a capacitance to a storage node. However, with the recent development of small memory cells, it is difficult to add a large capacitance in a simple process. In addition, it is unable to add a capacitance that is large enough to prevent soft errors to a high-speed SRAM because of the operation speed.

Besides the addition of a capacitance, another measure against to soft errors is to optimize the impurity concentration profile of a cell node diffusion layer or a substrate (well). One method for optimizing the impurity concentration profile of a cell node diffusion layer or a substrate (well) is to reduce electrons and positive holes to enter a cell node diffusion layer. A typical method is to form a well or a barrier layer in a well. However, a considerable amount of prototyping is required to determine the optimization conditions.

In the present circumstances, products are manufactured by combining various kinds of such measures, rather than employing any one of them. Therefore, a soft error rate SER cannot be determined until prototyping a product or TEG (Test Element Group).

The trend for SER of released SRAM varies by publisher. For example, P. Hazucha, et al., "Neutron Soft Error Rate Measurements in a 90-nm CMOS Process and Scaling Trends in SRAM from 0.25-μm to 90-nm Generation", 2003 IEEE International Electron Devices Meeting TECHNICAL DIGEST, pp. 523-526 (FIG. 16) (Document 1) describes that SER deteriorates (e.g. FIT value increases) by scaling process when a comparison is made per unit bit rate in each generation. On the other hand, Soon-Moon Jung, et al., "Soft Error Immune 0.46 μm² SRAM Cell with MIM Node Capacitor by 65 nm CMOS Technology for Ultra High Speed SRAM", 2003 IEEE International Electron Devices Meeting Technical Digest, pp. 289-292 (FIG. 9) (Document 2) and Ethan H. Cannon, et al., "SRAM SER in 90, 130 and 180 nm Bulk and SOI Technologies", 2004 IEEE International Reliability Physics Symposium, pp. 300-304 (FIG. 1) (Document 3) describe that SER generally improves (e.g. FIT value decreases) by scaling process. The reason of such a difference is probably a difference in voltage (node voltage) setting and cell size in SRAM in each generation.

In this background, it becomes increasingly important to accurately estimate SER of a scaling process device during the design phase. Simulation has been used for the estimation of SER.

Generally, the soft error simulation requires product process information, mask layout information, circuit information, nuclear reaction model and soon, and therefore there is a problem that it is only engineers with a good knowledge of a simulator (i.e. those who developed a simulator) who can use the simulator. An example of the simulation is described in Japanese Unexamined Patent Application Publication No. 2004-251813 (Ibe et al.). Ibe et al. discloses a technique of performing a simulation and feeding back a simulation result to product design, and a method of evaluating the simulation.

Further, there is a technique of performing a simulation using specific information as a parameter and putting results into a table, so that SER can be calculated simply by inputting a parameter. For example, Y. Tosaka, et al., "Simple Method for Estimating Neutron-Induced Soft Error Rates Based on Modified BGR Model", IEEE Electron Device Letters, VOL. EDL-20, NO. 2, pp 89-91, 1999 (Document 4) describes table model data using a MBGR method.

The use of the table model that is described in the above document enables easy calculation of SER with a calculator or the like. However, when using this table model, it is necessary to obtain, by simulation, a value (sensitive depth) d that is calculated from the relationship of cell size and depth with charges (critical charges) Qc required for the inversion of a cell node and a depletion layer W taken into consideration. Therefore, under the present circumstances, the use of a simulator is still needed in order to estimate SER during the design phase. Further, the verification of the accuracy of simulation is also needed. If SER can be estimated accurately without the use of a simulation during the phase of system design, it would be possible to take measures against soft errors in a system and thus offer convenience.

SUMMARY

In one embodiment, there is provided a calculation method of a soft error rate of a storage circuit or an information holding circuit. The method includes deriving a first mathematical expression indicating a dependence of a soft error rate on an information storage node diffusion layer area at the same information storage node voltage from a measurement result of a relationship between a soft error rate and the information storage node diffusion layer area of a storage circuit or an information holding circuit composed of a transistor with use of a plurality of information storage node voltages as a parameter; deriving a second mathematical expression indicating a soft error rate as a function of the information storage node diffusion layer area and an information storage node voltage by substituting a relationship indicating a dependence of a soft error rate on the information storage node voltage at the same information storage node diffusion layer area into the first mathematical expression; and calculating a soft error rate by substituting a desired information storage node diffusion layer area and a desired information storage node voltage into the second mathematical expression.

According to this embodiment, because the method derives the second mathematical expression indicating an soft error rate as a function of the information storage node diffusion layer area and the information storage node voltage from a measurement result of a relationship between a soft error rate and the information storage node diffusion layer area of a storage circuit or an information holding circuit using a plurality of information storage node voltages as a parameter, it is possible to calculate a soft error rate at a desired node voltage and a desired diffusion layer area without performing a simulation.

In another embodiment, there is provided a design method of a semiconductor integrated circuit including a storage circuit or an information holding circuit composed of a transistor. The method includes deriving a first mathematical expression indicating a dependence of a soft error rate on the information storage node diffusion layer area at the same information storage node voltage from a measurement result of a relationship between a soft error rate and an information storage node diffusion layer area of the storage circuit or the information holding circuit with use of a plurality of information storage node voltages as a parameter; deriving a second mathematical expression from the measurement result by substituting a relationship indicating a dependence of a soft error rate on an information storage node voltage at the same information storage node diffusion layer area into the first mathematical expression; calculating a soft error rate by substituting a desired information storage node diffusion layer area and a desired information storage node voltage into the second mathematical expression; calculating a converted information storage node diffusion layer area and/or a converted information storage node voltage, when the calculated soft error rate is equal to or larger than a prescribed value, by changing at least one of the information storage node diffusion layer area the information storage node voltage and a manufacturing process; and recalculating a soft error rate by substituting the converted information storage node diffusion layer area and/or the converted information storage node voltage into the second mathematical expression.

According to this embodiment, if a soft error rate that is estimated by deriving the second mathematical expression from an actually measured soft error rate and substituting a desired node voltage or diffusion layer area into the second mathematical expression is equal to or larger than a prescribed value, the method makes a design change and recalculates a soft error rate, thereby designing a semiconductor integrated circuit that satisfies the specification of a soft error rate. The present invention thus enables easy estimation of a soft error rate SER in SRAM or a storage circuit element during the product design phase.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
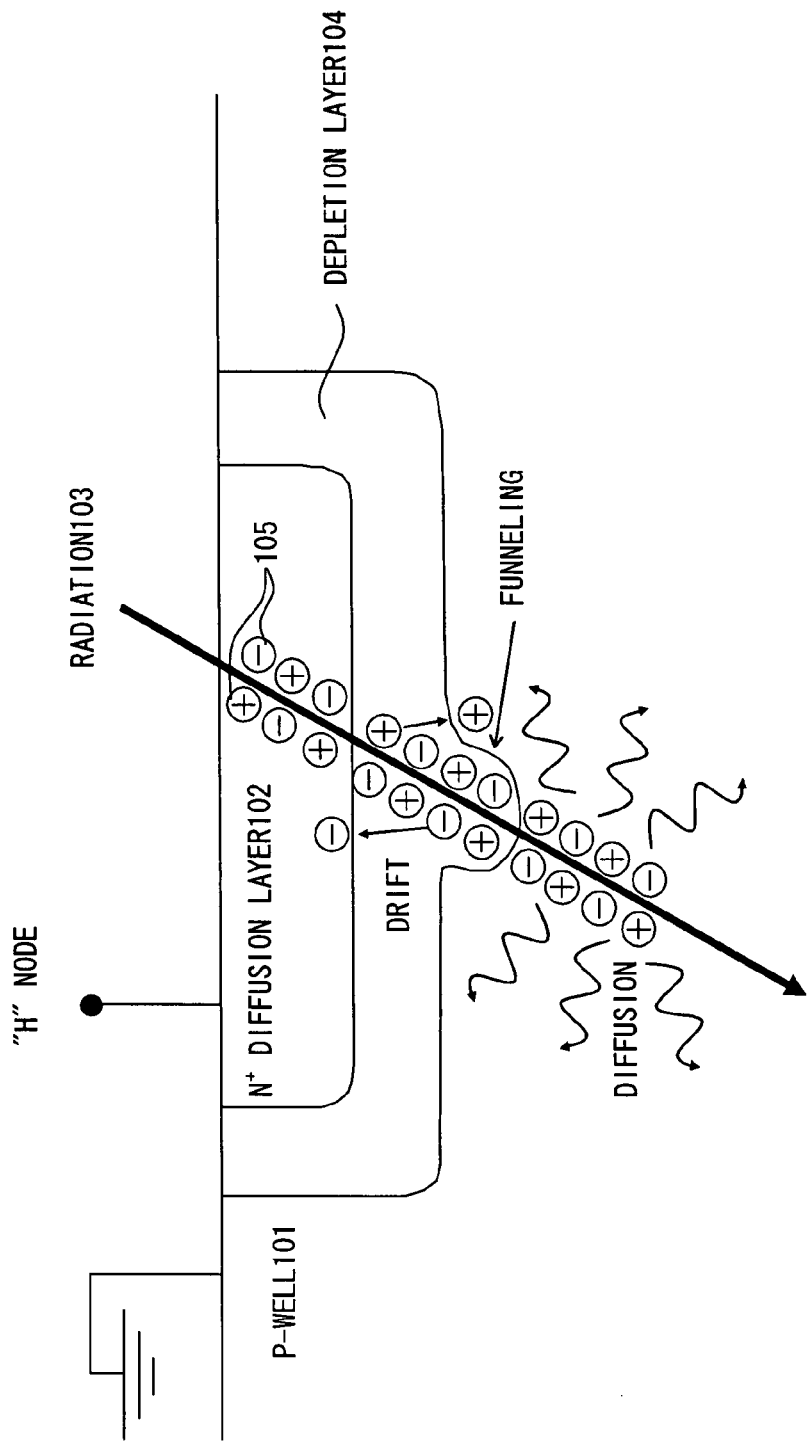
FIG. 1 is a view to describe a soft error.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments of the present invention are described hereinafter in detail with reference to the drawings. In the following embodiments, the present invention is applied to a SER calculation method capable of estimating a soft error rate (SER) of SRAM or a storage circuit element with a simple calculation and a semiconductor integrated circuit design method using the same. Specifically, the method estimates SER of a next-generation product accurately based on an area of a diffusion layer that holds data, a node voltage and a test result in a past generation.

As described above, although various methods have been proposed for the estimation of SER, they produce different results, and thus a regular estimation method is not yet established. In light of this, the inventors of the present invention have conducted intensive experimental work so as to achieve the accurate estimation of SER and found a method of estimating SER accurately prior to manufacturing a new product (i.e. during the design phase) by the use of SER data of existing products.

In order to estimate SER during the design phase, it is necessary to investigate by what factor SER is determined. A soft error in a data holding circuit such as DRAM, SRAM and F/F occurs when a carrier is generated by a radiation ray or a charged particle that enters a silicon substrate (hereinafter, which includes a well) and flows into an information node diffusion layer to thereby change an information node potential. In a broad sense, a soft error indicates a temporal malfunction that returns to normal function by rebooting or a reset signal, which is a term used in contrast with a hard error that is an unrecoverable defect, among device defects. In this description (where used in conjunction with semiconductor devices), a soft error indicates the inversion of stored information, which is in a narrow sense. Specifically, it is the data inversion of a storage element such as a memory cell that is caused by radiation or charged particles.

To facilitate the understanding of the present invention, a soft error is briefly described firstly. Radiations that cause soft errors involve an alpha particle that is emitted in the course of decay of atomic nucleus such as Uranium (U) or Thorium (Th) which is contained in a small amount in device packaging materials or line materials, and a cosmic ray (mainly, neutron) that reaches the ground.

If a radiation is incident on a semiconductor substrate, locally high-density electron-hole pairs are generated. If an electron or a hole is collected in a storage node diffusion layer, a storage node potential changes, which can induce the inversion of stored data to cause a soft error. The movement of electrons and holes that are generated in the substrate by the radiation in close proximity to a storage node diffusion layer ("H" node) of nMISFET is described hereinafter, taking CMOS SRAM as an example.

As shown in FIG. 1, when a radiation (particle) 103 such as an alpha radiation or a neutron radiation enters a storage node n-type diffusion layer 102 that is formed in a p-well 101, it collides with a nucleus to thereby generate a large number of hole-electron pairs 105 on the orbit of the particle. For example, an alpha radiation dislodges electrons by the Coulomb interaction when it propagates through the silicon. An average energy required for an alpha radiation to generate a single electron-hole pair is about 3.6 eV. The alpha radiation having the energy of 5 Mev generates about 1.4 million hole-electron pairs 105. At this time, a charge (which is an electron in the case of FIG. 1) is collected excessively as if the depletion layer 104 is expanded due to the local high electric field of the hole-electron pairs 105 that are generated by the radiation (secondary ion). FIG. 1 schematically illustrates such a state. The excessive charge collection is called a funneling effect, and the area where the depletion layer looks as if it is expanded is called a funneling region, for the sake of convenience.

In the depletion layer 104 and the funneling region, electrons and holes move by drift. Because the movement by drift is very fast, the generated charges move toward the storage node n-type diffusion layer 102 and a substrate 101 at once. Although the electrons and holes that are generated in other area than the depletion layer 104 and the funneling region move by diffusion, the movement by diffusion is slower than the movement by drift, and most electrons and holes annihilate each other by pair annihilation. However, some of them (which is an electron in FIG. 1) is captured into the storage node n-type diffusion layer 102.

The electrons and holes that are generated in the substrate are collected into the cell node diffusion layer by three main moving mechanisms of drift, funneling and diffusion depending on the positional relationship of the generated location and the depletion layer at the p-n junction formed between the storage node diffusion layer and the substrate. As a result of such a charge collection, the storage node potential changes largely and the inversion of stored data happens, so that a soft error occurs. The way that the carrier generated in the substrate is collected into the information node diffusion layer is described in Eiji Takeda, et al., "A Cross Section of a-Particle-Induced Soft-Error Phenomena in VLSI's", IEEE Transactions on Electron Devices, VOL. 36, NO. 11, pp 2567-2575, 1989 (Document 5).

The effects of scaling process on soft errors involve ALPEN effect and parasitic bipolar transistor activation phenomenon. The ALPEN effect is the phenomenon in which the inversion of information occurs when alpha particles penetrate the drain-source region of MISFET. The ALPEN effect is described in Eiji Takeda, et al., "A New Soft-Error Phenomenon in VLSIs; The alpha-particle-induced source/drain penetration (ALPEN) effect", 1988 IEEE International Reliability Physics Symposium, pp. 109-112 (Document 6) and Document 5. The same phenomenon occurs with ions, not only alpha particles. The ALPEN effect is likely to occur when the gate length of MISFET is short.

As the phenomenon that is close to the ALPEN effect, there is a case when a parasitic bipolar transistor, in which a source serves as an emitter, a substrate as a base, and a drain as a collector, turns on when a large number of electrons and holes are generated in close proximity to the source of MISFET by radiation.

Then, the potential of the drain decreases (or increases) to cause the inversion of information. An example of such a case is described in Kenichi Osada, et al., "SRAM Immunity to Cosmic-Ray-Induced Multierrors Based on Analysis of an Induced Parasitic Bipolar Effect", IEEE Journal of Solid-State Circuits, VOL. 39, NO. 5, pp 827-833, 2004 (Document 7).

The cases where soft errors occur involve when the information node diffusion layer (n-type) at "H" level becomes "L" level as a result of electrons flowing thereinto, and when the information node diffusion layer (p-type) at "L" level becomes "H" level as a result of positive holes flowing thereinto. Because a diffusion speed is different between electrons and holes as described later, the collected charges also differ.

The principle of the present invention is described hereinafter. In order to estimate SER of a device during the design phase, it is necessary to consider how the charges (collected charges) to be collected by the information node diffusion layer changes with scaling process. As a related art, the relationship between SER and a reduction ratio which is calculated by simulation is described in Ibe et al. that is mentioned above. Ibe et al. teaches that, as a size decreases, the resistance to soft errors improves substantially in proportion to the square value of the length per one dimension. The Ibe et al. also teaches the relationship of SER with a diffusion layer area.

Figure 2:
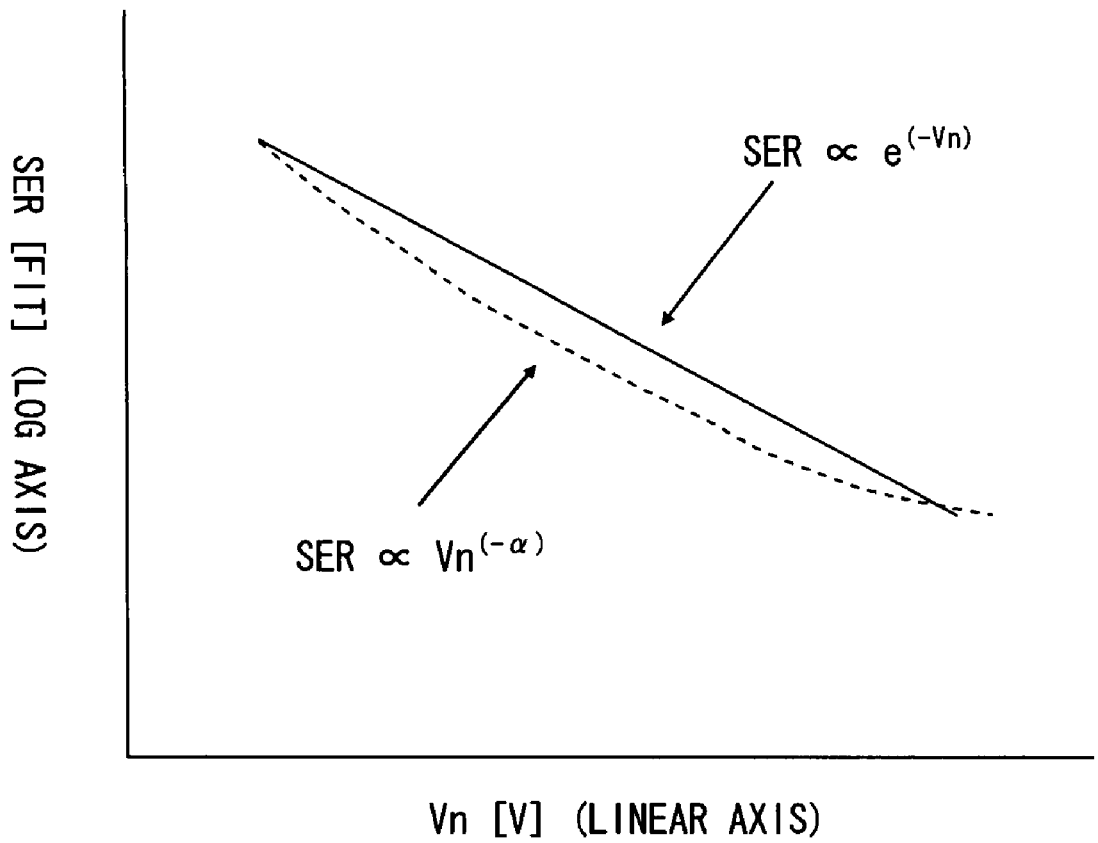
FIG. 2 is a graph showing the voltage dependence of a soft error rate SER of SRAM.

Further, a voltage dependence of SER in SRAM as shown in FIG. 2 is known. Specifically, SER deteriorates exponentially as a cell node voltage Vn decreases. Such a relationship is described in many papers (for example, see FIG. 3 etc. in P. E. Dodd, et al., "Neutron-Induced Soft Errors, Latchup, and Comparison of SER Test Methods for SRAM Technologies", 2002 IEEE International Electron Devices Meeting Technical Digest, pp. 333-336 (Document 8)).

SER fits an actual measurement value by power or exponential approximation of a cell node voltage Vn. Thus, the SER and the cell node voltage Vn have the relationship that is represented by the following expression 1 or 2, where k is a fitting parameter.

$$SER \propto \exp(-Vn) \qquad \text{Expression 1}$$

$$SER \propto Vn^{\wedge}(-k) \qquad \text{Expression 2}$$

The document 8 describes that SER can be approximated with the cell node voltage Vn regardless of cell size. This result is obtained from the measurement at a wide range of cell node voltage, and a cell with a high node voltage would have a large cell size. However, in the recent micro-fabricated, low-voltage devices, it causes a large margin of error to express SER with the expression of a node voltage only.

Figure 3:
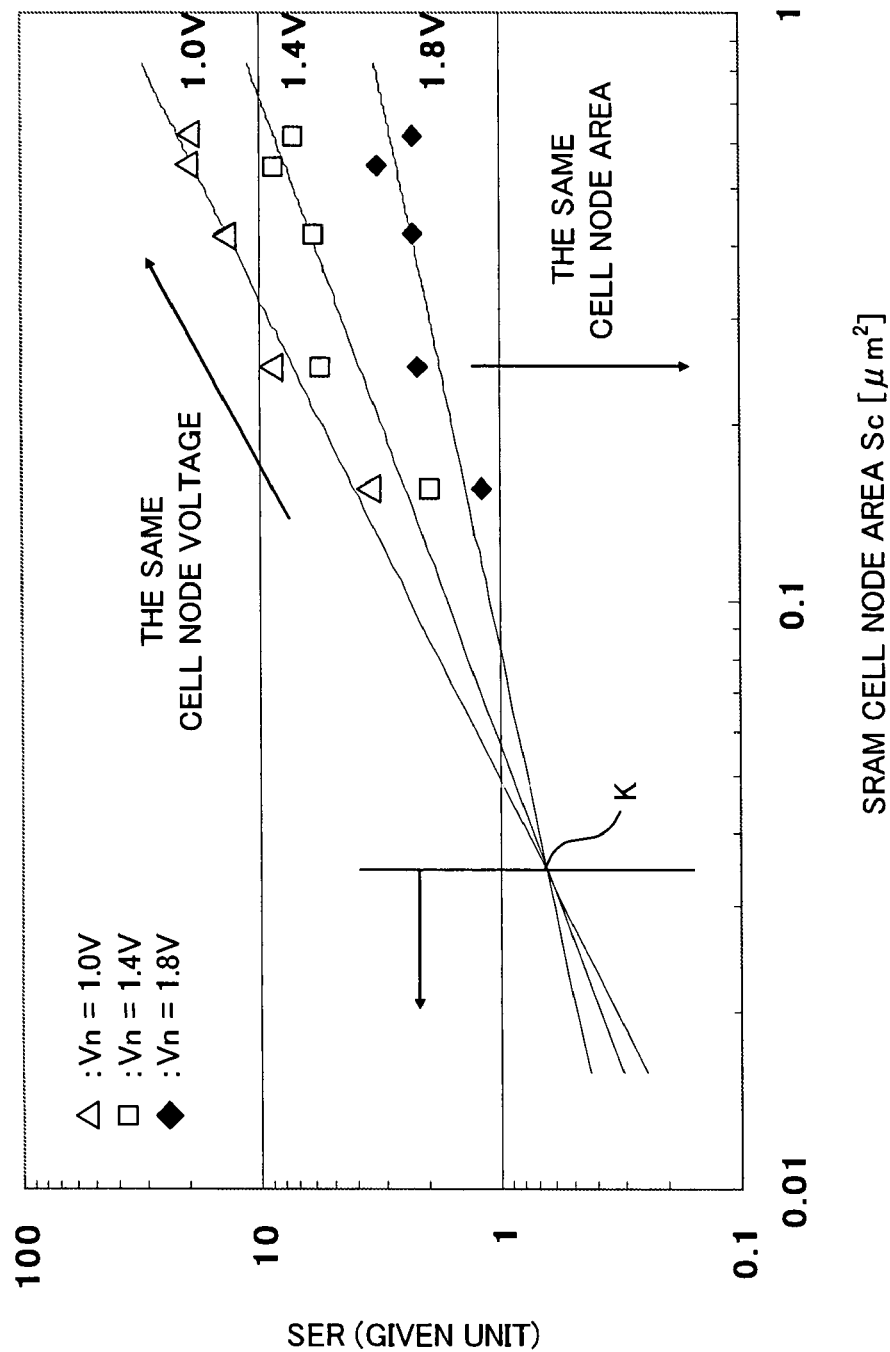
FIG. 3 is a graph showing a measurement result of SER by the inventors of the present invention, which indicates the relationship of SER with respect to a cell node voltage Vn and a cell node diffusion layer area Sc.

In view of the foregoing, in order to estimate a soft error rate SER, it is necessary to determine the relationship of SER with three factors of a cell node capacitance Cs, a cell node voltage Vn, and a cell node diffusion layer area (related to collected charges) Sc. FIG. 3 shows the result of measurement about the relationship of SER with a cell node area of SRAM which was conducted by the inventors of the present invention. Based on the measurement results shown in FIG. 3, the inventors of the present invention found a method of estimating SER from the cell node capacitance Cs, the cell node voltage Vn and the cell node diffusion layer area Sc.

FIG. 3 shows the measurement result of SER measured by applying alpha particles to SRAM, which was obtained by the inventors of the present invention. It shows the measurement result of SER of SRAM with different storage node sizes at the same node voltage. The vertical axis indicates the normalized SER, and the horizontal axis indicates the area of a cell node diffusion layer (a sum of node areas of both nMISFET and pMISFET). In FIG. 3, although a process is different for different storage node sizes, reduction close to a general scaling rule is performed for each cell.

A soft error rate SER is an average value of soft error rates that are measured by writing the data side (H/L) to a checkerboard pattern as write information to a cell. FIG. 3 shows the measurement results of SER at three cell node voltages Vn of 1.0V, 1.4V and 1.8V. Based on the result of FIG. 3, the inventors of the present invention found that the following expression is satisfied:

$$SER \propto F(Sc, Vn) \qquad \text{Expression 3}$$

where F(@) indicates the function of @. Accordingly, SER can be represented by the function of Sc and Vn.

The three straight lines shown in the graph of FIG. 3 indicate the result of automatic fitting approximation using computer software. FIG. 3 shows that the expression 3 is applicable to a considerably wide range of the cell node voltage Vn (1.0 to 1.8V) and the cell node diffusion layer area Sc.

Further, a value of a to minimize an error when the relationship of FIG. 3 is expressed as:

Cell node diffusion layer area $Sc=Scn+a*Scp$ using the information holding node diffusion layer area Scn composed of nMISFET and the information holding node diffusion layer area Scp composed of pMISFET was examined. As a result, an error was minimized when the value of a is 0.4. According to C. Hu "Alpha-Particle-Induced Field and Enhanced Collection of Carriers", IEEE Electron Device Letters, VOL. EDL-3, NO. 2, pp 31-34, 1982 (Document 9), as the mobility of carries is included in the expression indicating the funneling effect, the difference indicates a difference in the mobility between electrons and holes, and the area of the node diffusion layer composed of nMISFET is larger than the area of the node diffusion layer composed of pMISFET when comparing the areas of the node diffusion layers of a tested SRAM.

Further, it is notable in the result of FIG. 3 that a voltage dependence of SER disappears at a certain value K of the cell node diffusion layer area Sc. The detail is described later.

From the above test result, the inventors of the present invention found a method of estimating SER of SRAM easily and accurately by the following process.

[1] The relationship of a soft error rate (SER) with the information holding node diffusion layer area Sc of SRAM composed of nMISFET and pMISFET is measured using a plurality of node voltages Vn as a parameter. In other words, the graph of FIG. 3 is created.

[2] From the measurement result, a first mathematical expression that is represented by the following expression 4 which indicates the dependence of a soft error rate SER on the information holding node diffusion layer area Sc at the same information holding node voltage Vn is derived for each cell. The first mathematical expression can be easily obtained by automatic fitting using commercially available software with the use of a personal computer (hereinafter referred to as PC) or the like.

$SER=f*Sc^{\wedge}(g)$ or $SER=f*\exp(g*Sc)$  Expression 4 where f and g have a dependence on the cell node voltage Vn.

[3] From the measurement result, the relationship indicating the dependence of a soft error rate SER on the information holding node voltage Vn at the same information holding node diffusion layer area Sc is substituted into the first mathematical expression to thereby derive a second mathematical expression. In other words, f and g are expressed as the function of Vn from the relationship between SER and the cell node voltage Vn in each cell.

In this step, it is preferred to obtain an approximate expression by automatic fitting with the use of PC or the like for the optimal fitting. For example, in FIG. 3, three expressions for Vn=1.0V, 1.4V and 1.8V are obtained. From the three expressions, f1, f2, f3 and g1, g2, g3 are obtained respectively. Then, f is obtained as the function of Vn from f1, f2 and f3. Likewise, g is obtained as the function of Vn from g1, g2 and g3.

In this case, the test result can be approximated by the second mathematical expression that is represented by the following expression 5 or 6:

$SER=(a*Vn^{\wedge}b)*Sc^{\wedge}(p*\exp(q*Vn))$  Expression 5

$SER=(a*Vn^{\wedge}b)*Sc^{\wedge}(p*Vn+q)$  Expression 6

Whether to use the expression 5 or the expression 6 as the second mathematical expression depends on the test result. For example, the one with which the measurement result matches better may be selected.

[4] A soft error rate SER of SRAM to be estimated is calculated by substituting a desired information holding node diffusion layer area Sc (or cell size) and a desired information holding node voltage Vn into the second mathematical expression (the expression 5 or 6). The calculation can be performed easily using a PC or a scientific electronic calculator.

Devices used for the measurement of FIG. 3 include a product that is manufactured in a different process. The second mathematical expression that is derived in this method by the inventors of the present invention enables accurate fitting regardless of a difference in process.

According to the present invention, although it is necessary to actually measure SER or prepare existing measurement data at the beginning, it is possible to estimate SER easily after that. Further, the fitting result of the expressions 5 and 6 is highly accurate regardless of a difference in process as described above. The present invention thus produces a highly accurate result. Because the fitting is made with the use of actual measurement data in the present invention, the accuracy of estimation by the present method is high enough in view of the fact that the number of alpha particles in a material varies by the lot of molding material and that the number of neutrons varies by time (season) and place.

Although FIG. 3 is the graph which shows SER with respect to the cell node area Sc, it may be a graph which shows SER with respect to the cell node voltage Vn. In such a case, the expression representing the dependence of SER on the cell node voltage, which is the above expression 1 or 2, is obtained first.

$SER \propto \exp(-Vn)$  Expression 1

$SER \propto Vn^{\wedge}(-k)$  Expression 2

Then, the relationship indicating the dependence of SER on the information holding node diffusion layer area at the same cell node voltage is substituted into the expression 1 or 2, thereby obtaining the following expression or the like:

$SER=f(Sc)\exp(-Vn*g(Sc))$

First Embodiment

Figure 4:
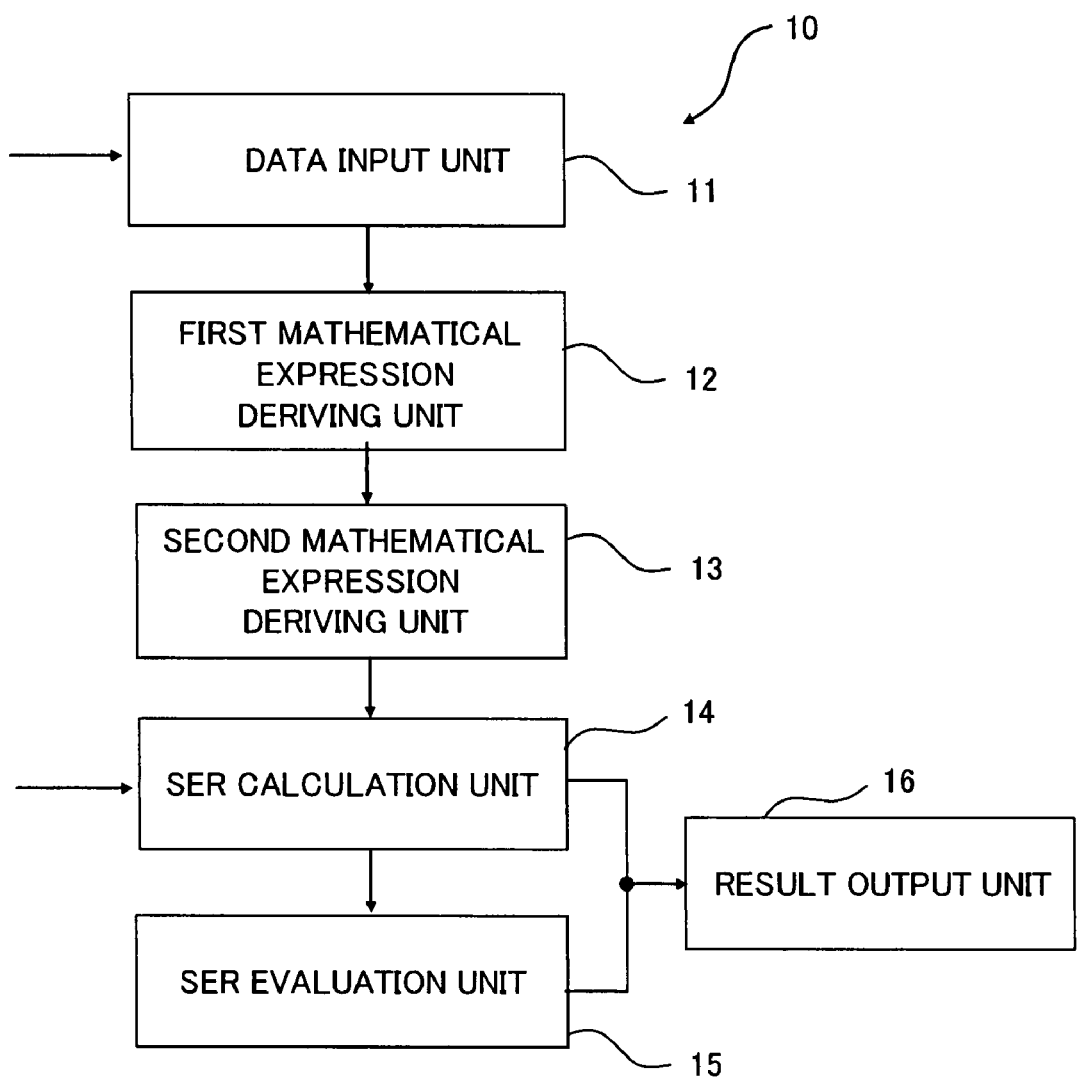
FIG. 4 is a view showing a semiconductor device design apparatus according to a first embodiment of the present invention.

A first embodiment of the present invention is described hereinafter. FIG. 4 is a view showing a semiconductor device design apparatus according to this embodiment. The design apparatus is configured to design a semiconductor device that includes a storage circuit or an information holding circuit which is composed of a transistor such as MISFET. Referring to FIG. 4, a semiconductor device design apparatus 10 includes a data input unit 11 to input a SER measurement result, first and second mathematical expression deriving units 12 and 13, a SER calculation unit 14 to estimate SER of a semiconductor device from the second mathematical expression, a SER evaluation unit 15 to evaluate a SER estimation result, and a result output unit 16 to output a SER estimation result or the like.

The data input unit 11 inputs a measurement result of a relationship between a soft error rate and an information storage node diffusion layer area of a storage circuit or an information holding circuit which is measured using a plurality of information storage node voltages as a parameter.

The first mathematical expression deriving unit 12 derives a first mathematical expression that indicates a dependence of a soft error rate on an information storage node diffusion layer area at the same information storage node voltage based on the measurement result supplied from the data input unit 11.

The second mathematical expression deriving unit 13 derives a second mathematical expression that indicates a soft error rate as the function of an information storage node diffusion layer area and an information storage node voltage from the measurement result by substituting the relationship indicating a dependence of a soft error rate on an information storage node voltage at the same information storage node diffusion layer area.

The SER calculation unit 14 calculates a soft error rate by substituting a desired information storage node diffusion layer area and a desired information storage node voltage into the second mathematical expression.

The SER evaluation unit 15 evaluates the soft error rate that is calculated in the SER calculation unit 14. If the calculated soft error rate SER is smaller than a prescribed value, the SER evaluation unit 15 lets the result output by the result output unit 16. On the other hand, if SER is equal to or larger than a prescribed value, that is, when a semiconductor device of which SER is estimated does not satisfy a given condition of SER, the SER evaluation unit 15 gives a notice through the result output unit 16, so that recalculation of SER is performed, for example.

Figure 5:
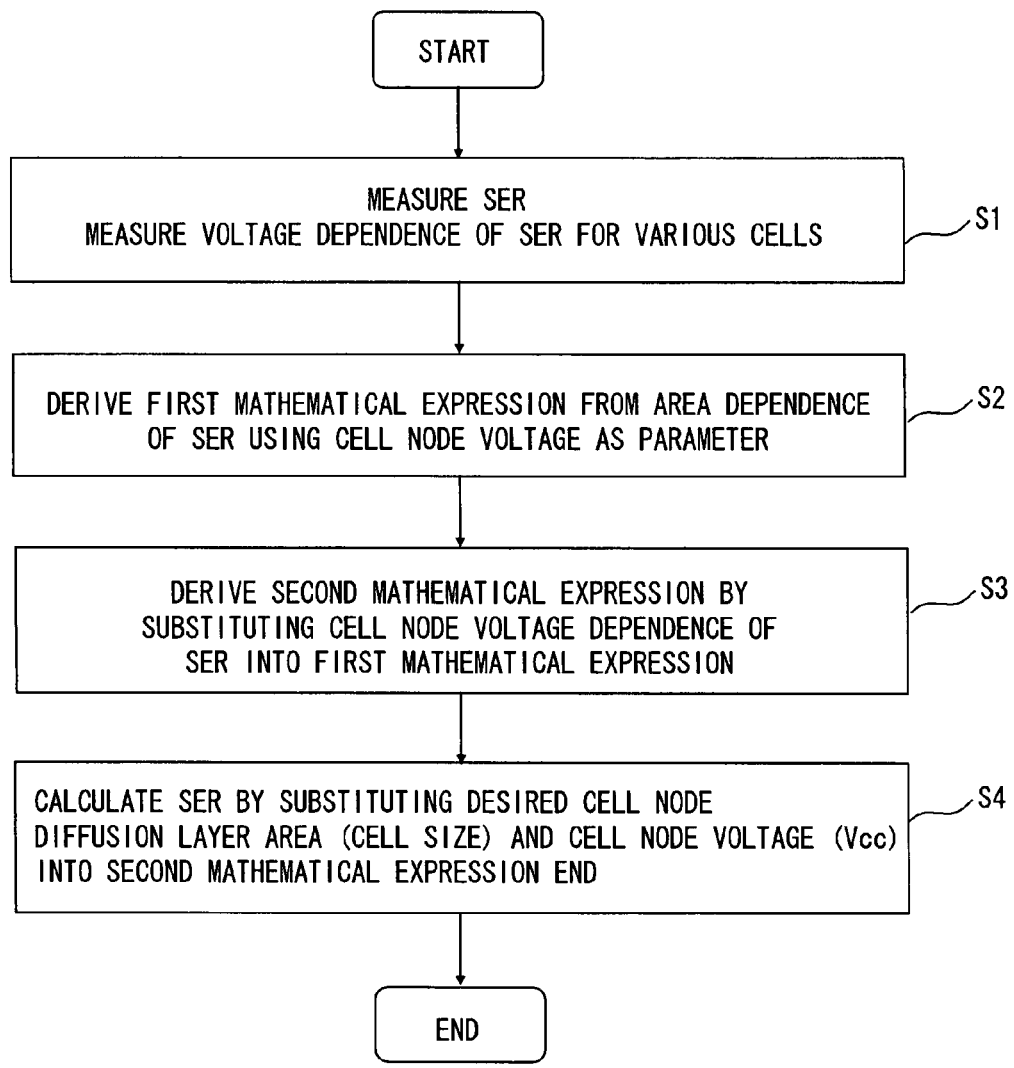
FIG. 5 is a flowchart showing a calculation method of SER according to the first embodiment of the present invention.

FIG. 5 is a flowchart showing a calculation method (estimation method) of SER. Firstly, a voltage dependence of SER is measured for a plurality of kinds of cells so as to create the graph as shown in FIG. 3 (Step S1). Then, a measurement result is input to the data input unit 11. Specifically, a result of measuring SER with different cell node areas Sc and cell node voltages Vn is input.

Then, the first mathematical expression deriving unit 12 derives the first mathematical expression (expression 4) that indicates a dependence of SER on an information storage node diffusion layer area at the same information storage node voltage for each cell as described above (Step S2). The first mathematical expression satisfies:

$$SER = f \cdot Sc^g$$

where SER is a soft error rate, Sc is an information storage node diffusion layer area, and f and g are fitting parameters.

Then, the second mathematical expression deriving unit 13 derives the second mathematical expression (expression 5 or 6) from the first mathematical expression (expression 4) with different cell node voltages Vn (Step S3). The second mathematical expression satisfies:

$$SER = (a \cdot Vn^b) \cdot Sc^{(p \cdot \exp(q \cdot Vn))} \quad \text{Expression 5}$$

$$SER = (a \cdot Vn^b) \cdot Sc^{(p \cdot Vn + q)} \quad \text{Expression 6}$$

where a, b, p and q are fitting parameters. When determining which of the expression 5 or 6 to be used, an appropriate one may be selected by a user, or the one with a higher fitting rate may be selected.

The SER calculation unit 14 retains the two mathematical expressions. When a user inputs a cell node voltage and a cell node area of a target device, the SER calculation unit 14 substitutes the input value into the second mathematical expression and outputs an estimated SER to the result output unit 16 (Step S4).

A user may reflect a display result in the result output unit 16 on the design of a semiconductor device. Because the apparatus of this embodiment includes the SER evaluation unit 15 that automatically evaluates SER, if SER does not satisfy a given condition, the SER evaluation unit 15 may prompt a user to input a converted information storage node diffusion layer area and a converted information storage node voltage, which are described later, or automatically generate converted values, and then recalculate SER after design change.

Figure 6:
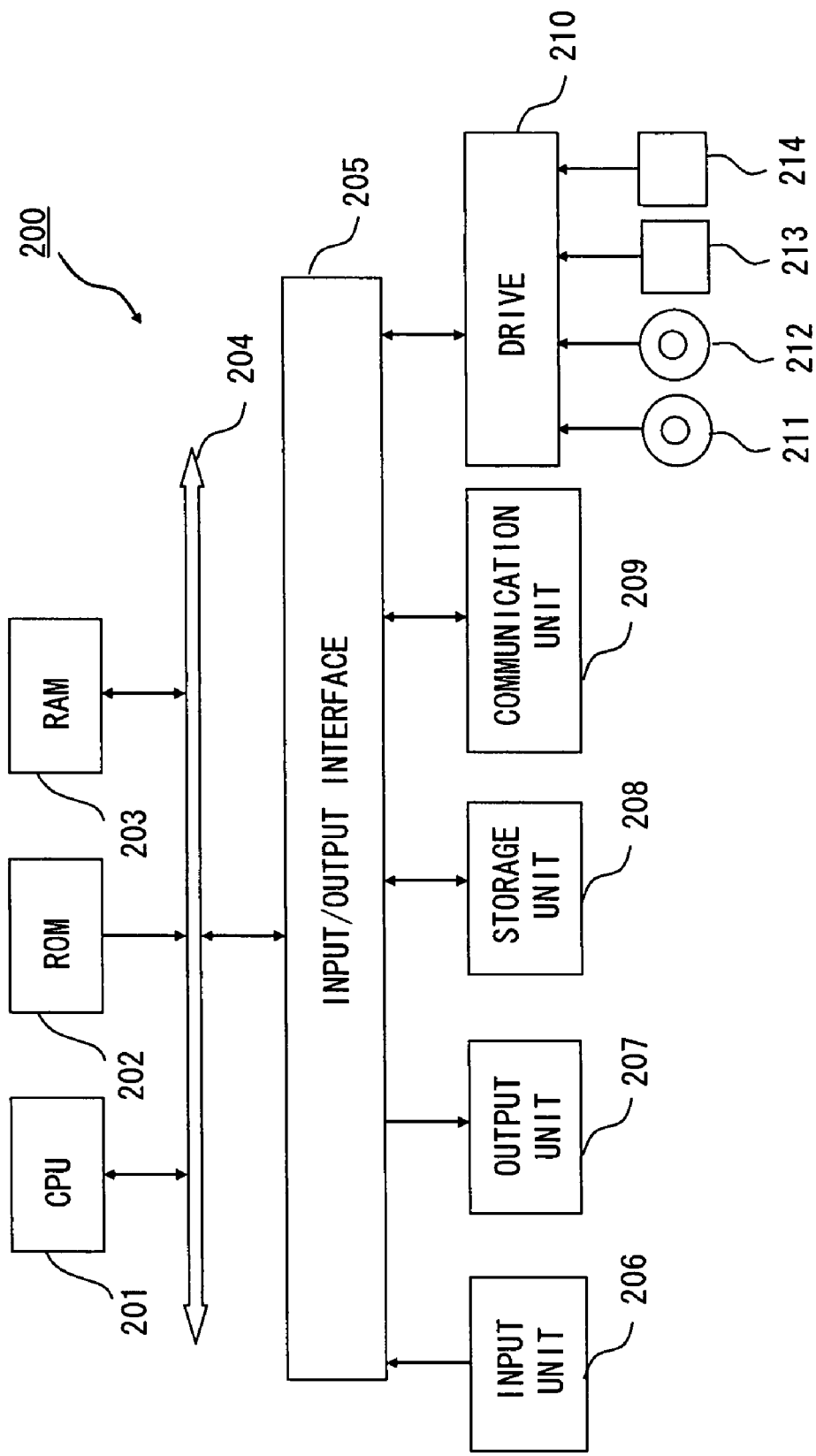
FIG. 6 is a block diagram showing a computer.

The semiconductor device design apparatus 10 may be implemented by a computer 200 as shown in FIG. 6. Referring to FIG. 6, the computer 200 includes a CPU (Central Processing Unit) 201, a ROM (Read Only Memory) 202, and a RAM (Random Access Memory) 203, which are connected through a bus 204. An input/output interface 205 is also connected to the bus 204.

The input/output interface 205 is connected with an input unit 206 such as a keyboard or a mouse, an output unit 207 such as a display (CRT, LCD etc.), a headphone or a loudspeaker, a storage unit 208 such as hard disk, and a communication unit 209 such as a modem or a terminal adapter.

The CPU 201 executes various processing according to a program to implement a software module stored in the ROM 202 and a program to implement a software module loaded from the storage unit 208 to the RAM 203. The RAM 203 also stores data necessary for the CPU 201 to execute various processing as appropriate.

The communication unit 209 performs communication through the internet, which is not shown. The communication unit 209 transmits data that is supplied from the CPU 201. The communication unit 209 also outputs data received from the other party of communication to the CPU 201, the RAM 203 and the storage unit 208. The storage unit 208 communicates with the CPU 201 and stores or erases information. The communication unit 209 also exchanges an analog signal or a digital signal with another apparatus.

If necessary, the input/output interface 205 is also connected with a drive 210, to which a magnetic disk 211, an optical disk 212, a flexible disk 213, a semiconductor memory 214 or the like is attached, and a computer program that is read from those media is installed to the storage unit 208 when needed.

Then, the semiconductor device design apparatus 10 implements given processing in each block by causing the CPU 201 to execute a computer program. A computer program may be provided by being stored in a storage medium or being transmitted through a transmission medium such as the internet.

This embodiment enables highly accurate estimation of SER during the phase of device design, and therefore it is possible to take various measures according to the estimation result. For example, it is possible to take measures against soft errors in a system according to the value of SER during the system design, which is started prior to obtaining an actual device. Specifically, a redundancy circuit such as ECC, an anti-malfunction program, or a fail-safe function in case of malfunction may be set according to SER.

Because SER can be calculated during the system design phase, it is possible to know the exact value of SER of a future product at earliest possible. Since this embodiment can offer not only SER at a normal voltage but also a voltage dependence of SER during the design phase when a product does not yet exist, it is possible to know how SER changes when SRAM or the like is used at a low voltage during stand-by, for example, so as to take appropriate measures against soft errors.

Second Embodiment

A second embodiment of the present invention is described hereinafter. As described in the first embodiment, it is possible to estimate SER in the phase of designing a semiconductor device, thereby enabling design change according to the estimation result, thus enabling measures against soft errors. The measures against soft errors involve adding a capacitor (which is referred to hereinafter as an additional capacitor) to a storage node of a cell transistor, replacing a substrate with SOI, and so on.

The SER estimation method in the first embodiment is applicable regardless of some difference in process because it uses data of a plurality of cells with the relationship close to general scaling. However, when an additional capacitor is added to an information storage node or when a SOI substrate is used, SER exhibits a different tendency from a previous-generation; as a result, the above-described estimation method cannot be used simply in some cases. This embodiment enables accurate estimation of SER even with the use of an additional capacitor or a SOI substrate.

A calculation method of SER when an additional capacitor is placed is described firstly. For example, a calculation method when an additional capacitor having a metal-insulator-metal (MIM) structure is placed on top of a substrate is described. The additional capacitor in this embodiment does not enlarge a diffusion layer area. Thus, the following description is based on the assumption that collected charges of a node diffusion layer remain the same.

Using the above-described second mathematical expression, SER is calculated for the case where no additional capacitor is placed. If a node voltage of a target memory cell node or an information storage node is Vo, a node capacitance is Co, and an estimated SER or a actually measured SER is SERo (in units of FIT), the following expression is satisfied:

$$SER \propto 1/[Vo*Co] \qquad \text{Expression 7}$$

If an additional capacitor to be added to a storage node is Ca and SER after the addition is SERa, the following expression 8 is satisfied:

$$SERa \propto 1/[Vo*(Co+Ca)] \qquad \text{Expression 8}$$

SER (when represented in units of FIT) is in inverse proportion to critical charges Qc as shown in the following expression 9, and the critical charges are in proportion to the information storage node voltage Vn.

$$SER \propto 1/Qc, \quad Qc \propto Vn \qquad \text{Expression 9}$$

From the expression 9 and the expression 8, it is determined if SERa when the additional capacitor Ca is added to a memory cell, a F/F circuit or a latch circuit having an information storage node with the information storage node voltage Vo and the information storage node capacitance Co corresponds to that when how much the node voltage increases at the node capacitance Co. Because the diffusion layer area remains the same, there is no change in collected charges at the information storage node, and if a converted increase in the information storage node voltage is Va, $$Va*Co = Vo*Ca.$$

Thus, the following expression 10 is satisfied:

$$Va = Vo*(Ca/Co) \qquad \text{Expression 10}$$

Therefore, SER that corresponds to the following converted voltage at the information storage node size (node capacitance) should be obtained.

$$Vn = Vo + Va = Vo(1+Ca/Co) \qquad \text{Expression 11}$$

In this way, when an additional capacitor is added to a cell node, SER can be estimated with the use of a converted information storage node voltage in place of an information storage node voltage.

A calculation method of SER when a SOI substrate is used is described herein. When using a SOI substrate, it is difficult to apply the above SER estimation method to the case where a bulk substrate is replaced by a SOI substrate because of a difference in the collected charges, a difference in the funneling effect, and a difference in the degree of the parasitic bipolar effect (which exists in other substrate than a SOI substrate) between a SOI substrate and a bulk substrate. If conditions change significantly, the present invention may be applied after prototyping TEG with different cell sizes (with a SOI substrate or under given conditions). It is also possible to estimate SER from the existing data for a bulk substrate using the above-described estimation method by obtaining a difference (decrease) in collected charges between a bulk substrate and a SOI substrate by actual measurement or simulation and then applying a rate of the decrease to a decrease in the cell node diffusion layer area.

As an example of a calculation method in such a case, the use of the present method for the estimation of SER is considered when replacing a bulk substrate with a SOI substrate. If a bulk substrate is replaced with a SOI substrate, the charges to be collected in a cell storage node diffusion layer decrease. The rate of decrease is obtained by simulation. Specifically, because the collected charges by radiation depend on a storage node diffusion layer area/volume or a distance between surrounding diffusion layers, the collected charges are treated as the function of those.

Then, a converted storage node diffusion layer area is obtained from SER of the storage node diffusion layer area of SER data of a bulk substrate using the following expression:

Converted storage node diffusion layer area=(Storage node diffusion layer area)×(Rate of decrease in collected charges)      Expression 12

By calculating SER that corresponds to the converted storage node diffusion layer area, SER in a SOI substrate can be estimated.

Further, even if a process (impurity profile) largely changes, it is possible to estimate SER by correcting the collected charges, focusing on fluctuations in the collected charges as described in the above example of a SOI substrate.

As described above, this embodiment allows the estimation of SER even when an additional capacitor is placed or when a SOI substrate is used by substituting a converted information storage node voltage or a converted information storage node diffusion layer area into the above-described first and second mathematical expressions. Accordingly, depending on an estimation result of SER, it is possible to make some design change such as placing an additional capacitor or using a SOI substrate as measures against soft errors and then estimate SER again.

Semiconductor integrated circuit design apparatus and design method with the use of a calculation method of SER according to this embodiment are described hereinafter. A design apparatus may have the same configuration as the design apparatus 10 shown in FIG. 4 which is described above.

In this embodiment, if an estimated SER is larger than a prescribed value, the SER evaluation unit 15 notifies the result by displaying it using the result output unit 16, for example. Then, the SER evaluation unit 15 lets the data input unit 11 input a converted information storage node diffusion layer area and a converted information storage node voltage when at least one of an information storage node diffusion layer area, an information storage node voltage, and a manufacturing process is changed. Alternatively, the SER evaluation unit 15 may automatically generate a converted information storage node diffusion layer area and a converted information storage node voltage according to the value of SER. After that, the SER calculation unit 14 recalculates SER.

Specifically, it is possible to add an additional capacitor or replace a substrate with an SOI substrate as described above. When an additional capacitor is added, an converted information storage node voltage which is represented by the expression 11 is input instead of an information storage node voltage. When a substrate is replaced with an SOI substrate, a converted information storage node diffusion layer area which is represented by the expression 12 is input instead of an information storage node diffusion layer area.

The SER calculation unit 14 recalculates a soft error rate SER by substituting the converted information storage node diffusion layer area and the converted information storage node voltage into the second mathematical expression. The SER evaluation unit 15 evaluates the SER again. According to the estimated SER, the SER evaluation unit 15 may make design change in such a way that SER of a semiconductor device falls below a prescribed value.

Figure 7:
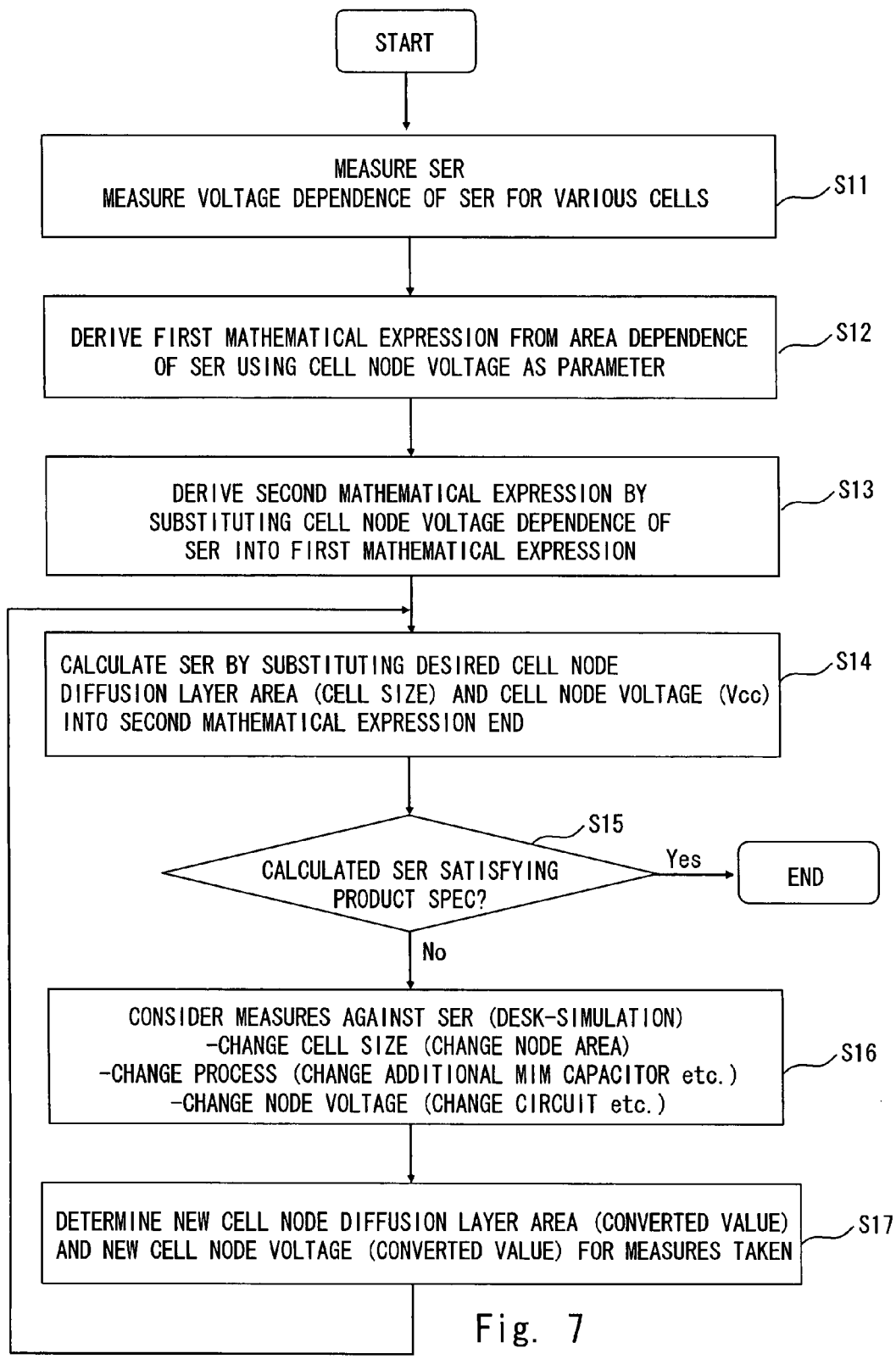
FIG. 7 is a flowchart showing a semiconductor device design method according to a second embodiment of the present invention.

FIG. 7 is a flowchart showing a semiconductor device design method according to this embodiment. Steps S11 to S14 are the same as Steps S1 to S4, respectively, in FIG. 5 described above. Then, the SER evaluation unit 15 determines whether SER that is calculated by the SER calculation unit 14 satisfies the product specification (Step S15) and, when it satisfies the specification, the process ends.

On the other hand, if the calculated SER does not satisfy the specification, appropriate measures against soft errors are taken according to a product (Step S16). For example, a node area may be changed by altering a cell size. A process may be changed by altering an additional MIM capacitor or the like. Further, a node voltage may be changed by altering a circuit configuration or the like. In this process, a new cell node diffusion layer area and a new cell node voltage for the recalculation of SER are determined (Step S17). As described earlier, if an additional capacitor is added or a substrate is replaced, a new cell node diffusion layer area and a new cell node voltage are used in place of a converted information storage node diffusion layer area and a converted information storage node voltage, respectively, represented by the above expressions 11 and 12. With the use of these values, the process repeats the processing from Step S14 that recalculates SER until the SER specification is satisfied.

According to this embodiment, it is possible to take various measures against soft errors according to an estimation result of SER. It is also possible to accurately estimate SER even when a capacitor is added or a substrate is replaced as measures against soft errors.

As other measures against soft errors, there are the use of a high-impurity material to reduce or shield a radiation, an increase in node charges (accumulated node charges) of a memory cell, and so on. In terms of materials and device structures, other measurements may be taken, including reduction of the emission of alpha particles by increasing the purity of packaging materials or line materials, coating of a chip surface with a film (polyimide film) for shielding alpha particles, and reduction of the collected charges generated in a substrate by radiation into a node diffusion layer by optimizing the distribution of impurities over a substrate. Soft errors may be reduced by such measures. Further, a more reliable memory system may be configured by implementing error correction functions such as ECC (Error Checking and Correction).

Generally, even if the generation of SRAM changes, the ratio of sizes (W of Tr) of a driver nMISFET, a transfer nMISFET and a load pMISFET which form a cell does not substantially change. Thus, the ratio of an $n^+$ node diffusion layer area and a $p^+$ node diffusion layer area is substantially the same between generations. Accordingly, it is presumed that a size at which a voltage dependence disappears would exist as shown in FIG. 3. If a size ratio (node diffusion layer area ratio) between nMISFET and pMISFET is different between generations, the mathematical expression may be modified as needed.

In any case, when deriving a mathematical expression from measurement data, an accurate approximate expression can be obtained by expressing SER as the function of a cell node diffusion layer area and then incorporating the function of a node voltage into the function of the cell node diffusion layer area.

Third Embodiment

As described in the above embodiments, the SER estimation method of the present invention enables the estimation of SER of SRAM, and further it is applicable to various cell structures. This embodiment provides a SER estimation method that is particularly suitable for use in the circuit configuration different from SRAM. The case where the present invention is applied to a F/F circuit, a latch circuit or the like including an inverter composed of pMISFET and nMISFET, which is different from a SRAM cell, is described hereinbelow.

Generally, a F/F circuit and a latch circuit have a different size ratio of pMISFET and nMISFET and a different diffusion layer interval from those of SRAM. In such a case, an expression that accurately approximates measurement data cannot be derived for some actually-measured circuits.

H. Fukui et al., "Comprehensive Study on Layout Dependence of Soft Errors in CMOS Latch Circuits and Its Scaling Trend for 65 nm Technology Node and Beyond", 2005 IEEE Symposium on VLSI Technology Digest of Technical Papers, pp. 222-223 (Document 10) describes that SER varies with the size of nMISFET and pMISFET. It is thus necessary to take each SER of pMISFET and nMISFET into account in order to estimate SER of a F/F circuit and a latch circuit more accurately.

Figure 8:
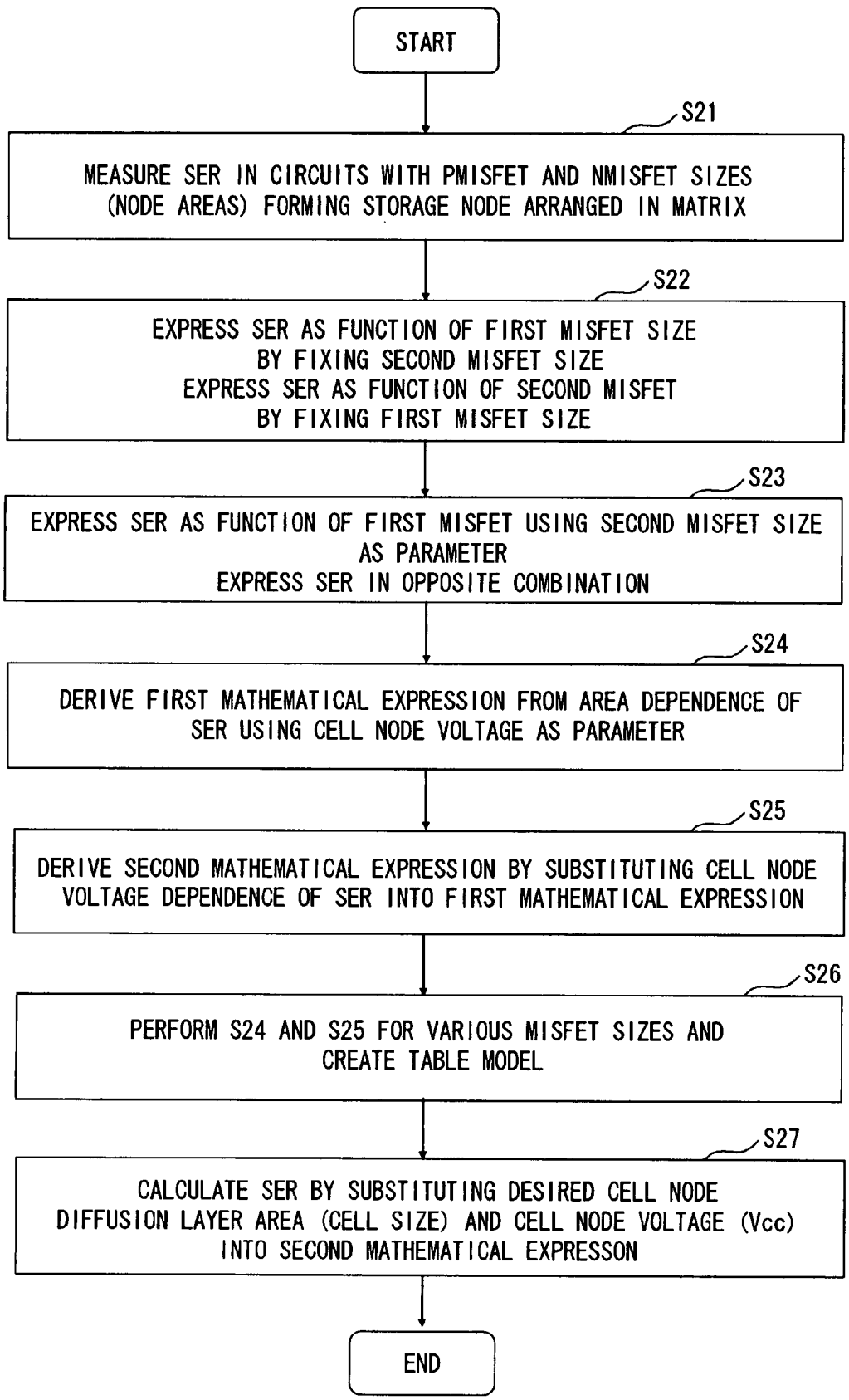
FIG. 8 is a flowchart showing a calculation method of SER according to a third embodiment of the present invention.

A calculation method of SER according to this embodiment is a method for estimating SER in such a case. FIG. 8 is a flowchart showing a SER calculation method according to this embodiment.

The method measures SER of a storage element or an information holding circuit that is composed of nMISFET and pMISFET of CMISFET (Complementary Metal Insulator Semiconductor Field Effect Transistor) in a plurality of circuits by fixing either one of the nMISFET size (diffusion layer area Scn) or the pMISFET size (diffusion layer area Scp) while changing the other MISFET size, with the use of a plurality of node voltages as a parameter (Step S21).

Figure 9:
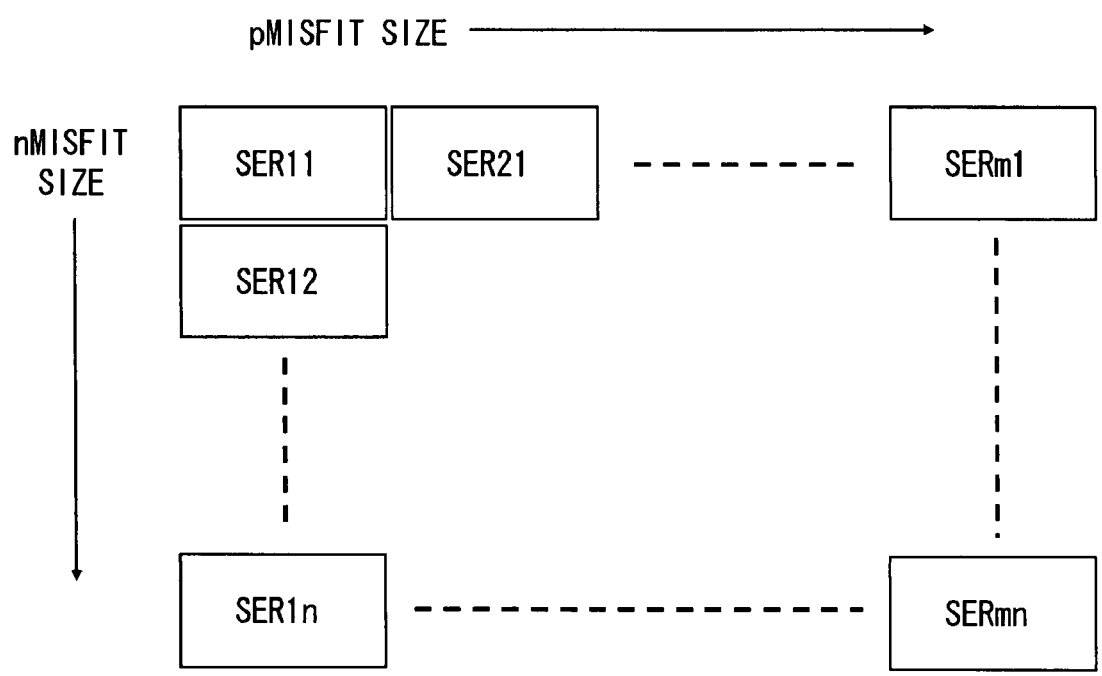
FIG. 9 is a view showing a circuit in which the sizes (node areas) of pMISFET and nMISFET that constitute a storage node are combined in matrix.

For example, SER may be measured in a circuit where the nMISFET size and the pMISFET size are arranged in matrix as shown in FIG. 9. The values of n and m may be normally 2 to 3. A dependence of SER on the sizes of nMISFET and pMISFET is measured at various voltages.

Ideally, SER is measured for each of n×m circuits (SER 11 to SERmn) in matrix. However, it is sometimes difficult to measure SER in a large number of circuits. In such a case, SER may be measured in an appropriate combination of pMISFET and nMISFET by selecting about three kinds of pMISFET sizes and nMISFET sizes, for example. Then, a size dependence on each MISFET is measured. It is thereby possible to estimate SER without measuring SER in all circuits.

For example, a graph with the nMISFET size along the horizontal axis and the SER actual measurement value along the vertical axis is created using the pMISFET size as a parameter. If the measurement is performed by setting nMISFET and pMISFET to three sizes each (Na, Nb, Nc and Pa, Pb and Pc), the nMISFET size is Na, Nb, Nc when the pMISFET size is Pa, and therefore SER at another size of nMISFET can be also estimated. Likewise, SER can be estimated for Pb and Pc. Then, another graph is created in the same manner with the pMISFET size along the horizontal axis, so that SER with a combination of the pMISFET and nMISFET sizes that is used in products can be obtained.

If SER caused by nMISFET is SERn, and SER caused by pMISFET is SERp, measured SER (total SER: SERt) is represented by the following expression:

$$SERt = SERn + SERp \quad \text{Expression 13}$$

It is difficult to directly measure SERn and SERp in the expression 13. Thus, SER is measured in a circuit where the sizes (node areas) of pMISFET and nMISFET that form storage nodes are arranged in matrix as described above. Alternatively, SER may be measured by combination of actual measurement and simulation. Specifically, if it is difficult to measure SER in n×m kinds of circuits, it is possible to use actual measurement values for some circuits and to complement SER by simulation for the other circuits in which the measurement cannot be performed.

Then, with the size of one of n- or p-MISFET fixed, SER is represented as the function of the size of the other one of MISFET (Step S22). For example, SER is represented as the function of pMISFET size by fixing the nMISFET size. Next, by changing the type of MISFET whose size is to be fixed, SER is represented in the same manner as the function of the other type of MISFET. In the above example, SER is represented as the function of nMISFET size by fixing the pMISFET size.

Then, SER is represented as the function of one type of MISFET by using the size of the other type of MISFET as a parameter. Further, SER is represented with the opposite combination (Step S23). For example, SER is represented as the function of pMISFET using the size of nMISFET as a parameter, and then SER is represented as the function of nMISFET using the size of pMISFET as a parameter.

After that, the same processing as in Step S2 shown in FIG. 5 is performed. Specifically, the first mathematical expression using a cell node voltage as a parameter is derived form the area dependence of SER (Step S24). For example, the first mathematical expression is derived for SER 11 in FIG. 9.

Then, like Step S3 in FIG. 5, the relationship indicating a dependence of a soft error rate on an information holding node voltage Vn at the same information holding node diffusion layer area is substituted into the first mathematical expression that is obtained in Step S24, thereby deriving the second mathematical expression (Step S25). In the above example, the second mathematical expression is derived for SER 11 as in Step S24.

The process then repeats Steps S24 and S25 to derive the first and second mathematical expressions for various MISFET sizes and thereby creates a table model (Step S26). Using the created table model, desired MISFET size or voltage value are obtained in the same way as Step S4 in FIG. 5. If there is no combination of desired sizes of MISFET in the table model, it is possible to make calculation using a close combination and approximate the value based on the calculation result.

This embodiment enables accurate estimation of SER with the use of a table model. Although SER can be estimated in a F/F circuit or a latch circuit in the same manner as in a SRAM cell, the estimation of SER is difficult if there are various sizes of pMISFET and nMISFET because critical charges and collected charges vary with each other. Thus, the SER estimation method of this embodiment obtains a MISFET size dependence in matrix and creates a table model, thereby achieving a generally-applicable SER calculation method. Further, this allows the size dependence of SER to be represented in a mathematical expression:

$$SERn = F(Scn, Scp), \quad SERp = F(Scn, Scp)$$

where F(*) indicates the function of *. It is thereby possible to provide a more generally-applicable SER calculation method. The SER estimation method can be used for the estimation of SER in a F/F circuit or the like having a similar node area with the use of SRAM data.

As shown in FIG. 3, it was found from the data measured by the inventors of the present invention that a dependence of SER on a cell node voltage disappears upon reaching a certain storage node area (0.03 to 0.04 µm$^2$).

The storage node area at which SER ceases to depend on a storage node voltage, which is referred to hereinafter as the node voltage independence point (NVIP), in FIG. 3 has the following implication. As described earlier, SER is determined by the relationship between the accumulated charges at an information storage node (it may simply represented by the product of a node capacitance and a node voltage) and a collected amount of carriers (collected charges) that are generated by radiation.

NVIP exists probably because the following two effects on SER cancel each other when an information storage node voltage becomes high. The two effects are:

Effect 1: the effect of reducing SER by increasing the accumulated charges at the information node Effect 2: the effect of increasing SER by increasing the effective collected charges of carriers generated in a cell node diffusion layer by radiation due to an increase in the width of a depletion layer in a diffusion layer, an increase in parasitic bipolar effect, a difference in substrate potential distortion and so on. However, in case of the parasitic bipolar effect or ALPEN effect is more significant, a correlation plot of SER and cell node area in not always form a straight line as shown in FIG. 3.

The effective collected charges indicate the amount of collected charges that includes collected charges which are converted from SER generated by the parasitic bipolar effect or the like, in addition to normal collected charges. For example, a measured SER in a certain circuit is SERa, SER by actually collected charges Qb is SERb, and SER generated by the parasitic bipolar effect or the like is SERc. A value that converts SERc by the parasitic bipolar effect or the like into collected charges is Qc. At this time, although the actually collected charges of this circuit are Qb, apparent collected charges are Qb+Qc. The value of Qb+Qc is referred to as the effective collected charges.

FIG. 3 shows the test result by alpha particle radiation. The inventors of the present invention also measured NVIP at substantially the same cell node area in the case of neutron radiation, which is one of radiation rays to cause soft errors on the ground. Because crucial charges generally decrease in a scaling process cell, the effect of lighter ionic species among the secondary ions that are generated by the reaction of high-energy neutrons and a Si substrate increases. This is also described in Ibe et al. as a simulation result. Therefore, NVIP for neutrons exists at substantially the same area as NVIP obtained in the alpha particle radiation experiment.

NVIP for SER is important in that the relationship between SER and a cell voltage changes at NVIP. Generally, SER is better as a power supply voltage (node voltage) is higher. However, a dependence of SER on the power supply voltage (node voltage) decreases as a node diffusion layer area becomes smaller, and it finally reaches at NVIP. At a smaller node diffusion layer area than NVIP, SER improves because it no longer exhibits a voltage dependence, the operation of a bipolar transistor can be suppressed at a low voltage, and so on. This implies that, when the cell is not selected or the information storage node element is not selected (i.e. activated), it is preferred to minimize a power supply voltage (node voltage), so that a selected cell or a selected information storage node element operate at the same voltage as in the normal peripheral circuit.

Specifically, if a selected cell voltage is VDD, a non-selected cell voltage is Vn (Vh<Vn<VDD). Although a non-selected cell voltage cannot be reduced because of constraints of the measures against soft errors, because a voltage dependence is small and thus a soft error rate SER does not increase when a cell voltage becomes smaller in the range where the node diffusion layer area is smaller than NVIP, it is possible to reduce power consumption by setting a non-selected cell voltage to be lower than a selected cell voltage VDD.

It is desirable for a SRAM which comprises a plurality of cells and a peripheral circuit that an area of one storage node diffusion layer of the cells is smaller than about $0.04\ \mu m^2$, and a selected cell of the cells receives a power supply voltage higher than that of non-selected cells of the cells. The higher power supply voltage is as the same as power supply voltage for the peripheral circuit. Further, the supply voltage of the non-selected cells are lower than that of the selected cell, and are higher than a minimum voltage to hold an information of the cells.

The present invention is not restricted to the above-mentioned embodiments, and various changes may be made without departing from the scope of the invention. For example, the above embodiments calculate SER in a storage circuit or an information holding circuit such as SRAM that is composed of MISFET, it may calculate SER in a semiconductor integrated circuit that is composed of a bipolar transistor.

It is apparent that the present invention is not limited to the above embodiments, but may be modified and changed without departing from the scope and spirit of the invention.

What is claimed is:

1. A calculation method of a soft error rate of a storage circuit or an information holding circuit, comprising:
   deriving a first mathematical expression indicating a dependence of a soft error rate on an information storage node diffusion layer area at the same information storage node voltage from a measurement result of a relationship between a soft error rate and the information storage node diffusion layer area of a storage circuit or an information holding circuit composed of a transistor with use of a plurality of information storage node voltages as a parameter;
   deriving a second mathematical expression indicating a soft error rate as a function of the information storage node diffusion layer area and the information storage node voltage by substituting a relationship indicating a dependence of a soft error rate on the information storage node voltage at the same information storage node diffusion layer area into the first mathematical expression; and
   calculating a soft error rate by substituting a desired information storage node diffusion layer area and a desired information storage node voltage into the second mathematical expression.

2. The calculation method of a soft error rate according to claim 1, wherein
   the first mathematical expression satisfies:

$SER = f * Sc\char`^(g)$ or $SER = f * \exp(g * Sc)$ where SER is the soft error rate, Sc is the information storage node diffusion layer area, and f and g are fitting parameters.

3. The calculation method of a soft error rate according to claim 2, wherein
   the second mathematical expression satisfies:

$SER = (a * Vn\char`^b) * Sc\char`^(p * \exp(q * Vn))$ or $SER = (a * Vn\char`^b) * Sc\char`^(p * Vn + q)$ where SER is the soft error rate, Sc is the information storage node diffusion layer area, Vn is the information storage node voltage, and a, b, p and q are fitting parameters.

4. The calculation method of a soft error rate according to claim 2, further comprising:
   determining a value of a such that $SER \propto F(Sc)$, $Sc = Scn + a * Scp$ fits best with an actual measurement value, where Scn is the information storage node diffusion layer area composed of an n-type transistor, Scp is the information storage node diffusion layer area composed of a p-type transistor, F(Sc) is a function of the information storage node diffusion layer area Sc, and a is a constant in the storage circuit or the information holding circuit.

5. The calculation method of a soft error rate according to claim 1, wherein
   the second mathematical expression satisfies:

$SER = (a * Vn\char`^b) * Sc\char`^(p * \exp(q * Vn))$ or $SER = (a * Vn\char`^b) * Sc\char`^(p * Vn + q)$ where SER is the soft error rate, Sc is the information storage node diffusion layer area, Vn is the information storage node voltage, and a, b, p and q are fitting parameters.

6. The calculation method of a soft error rate according to claim 5, further comprising:
   determining a value of a such that $SER \propto F(Sc)$, $Sc = Scn + a * Scp$ fits best with an actual measurement value, where Scn is the information storage node diffusion layer area composed of the n-type transistor, Scp is the information storage node diffusion layer area composed of a p-type transistor, F(Sc) is a function of the information storage node diffusion layer area Sc, and a is a constant in the storage circuit or the information holding circuit.

7. The calculation method of a soft error rate according to claim 5, wherein $Vn(1 + Ca/Co)$ is substituted into Vn of the second mathematical expression where Ca is a capacitance of a capacitor added above the storage node diffusion layer to avoid direct collection of carries from a substrate, Vn is the storage node voltage of the storage circuit or the information holding circuit, and Co is a storage node capacitance.

8. The calculation method of a soft error rate according to claim 1, further comprising:
measuring a soft error rate with different sizes of a p-type transistor and an n-type transistor constituting the storage circuit or the information holding circuit.

9. The calculation method of a soft error rate according to claim 1, further comprising:
calculating a converted information storage node diffusion layer area and/or a converted information storage node voltage, when the calculated soft error rate is equal to or larger than a prescribed value, by changing at least one of the information storage node diffusion layer area, the information storage node voltage and a manufacturing process; and
recalculating a soft error rate by substituting the converted information storage node diffusion layer area and/or the converted information storage node voltage into the second mathematical expression.

10. The calculation method of a soft error rate according to claim 9, wherein
the converted information storage node diffusion layer area is a converted value when a drain area of the transistor is changed.

11. The calculation method of a soft error rate according to claim 9, wherein
the converted information storage node diffusion layer area is a converted value corresponding to an amount of carries generated by radiation and collected into the information storage node diffusion layer.

12. The calculation method of a soft error rate according to claim 11, wherein
the amount of carries generated by radiation and collected into the information storage node diffusion layer is a simulation value or a measurement value of a test device.

13. The calculation method of a soft error rate according to claim 9, wherein
the converted information storage node voltage varies corresponding to a capacitance of the capacitor added above the diffusion layer of the transistor.

14. The calculation method of a soft error rate according to claim 1, wherein
the storage circuit or the information holding circuit is composed of MISFET.

15. A design apparatus of a semiconductor integrated circuit including a storage circuit or an information holding circuit composed of a transistor, comprising:
a first mathematical expression deriving unit to derive a first mathematical expression indicating a dependence of a soft error rate on an information storage node diffusion layer area at the same information storage node voltage from a measurement result of a relationship between a soft error rate and the information storage node diffusion layer area of the storage circuit or the information holding circuit with use of a plurality of information storage node voltages as a parameter;
a second mathematical expression deriving unit to derive a second mathematical expression indicating a soft error rate as a function of the information storage node diffusion layer area and the information storage node voltage by substituting a relationship indicating a dependence of a soft error rate on the information storage node voltage at the same information storage node diffusion layer area into the first mathematical expression; and
a SER calculation unit to calculate a soft error rate by substituting a desired information storage node diffusion layer area and a desired information storage node voltage into the second mathematical expression.

16. The design apparatus of a semiconductor integrated circuit according to claim 15, further comprising:
a SER evaluation unit to evaluate a soft error rate calculated by the SER calculation unit.

17. The design apparatus of a semiconductor integrated circuit according to claim 15, wherein
when the calculated soft error rate is equal to or larger than a prescribed value, the SER evaluation unit causes input of a converted information storage node diffusion layer area and/or a converted information storage node voltage calculated by changing at least one of the information storage node diffusion layer area, the information storage node voltage and a manufacturing process; and
the SER calculation unit recalculates a soft error rate by substituting the converted information storage node diffusion layer area and/or the converted information storage node voltage into the second mathematical expression.

18. A static random memory (SRAM) device comprising;
a plurality of cells; and
a peripheral circuit;
wherein an area of one storage node diffusion layer of the cells is smaller than about 0.04 $\mu m^2$, and
wherein a selected cell of the cells receives a power supply voltage higher than that of a non-selected cell of the cells and the power supply voltage is as the same as a power supply voltage for the peripheral circuit.

19. The SRAM device according to claim 18, wherein the supply voltage of the non-selected cell is lower than that of the selected cell, and is higher than a minimum voltage to hold an information of the cells.

* * * * *